United States Patent [19]
Morita

[11] 3,949,322
[45] Apr. 6, 1976

[54] STABLE PULSE WIDTH CONTROL FOR ASTABLE MULTIVIBRATORS AND THE LIKE

[75] Inventor: Koji Morita, Tokyo, Japan
[73] Assignee: Sony Corporation, Tokyo, Japan
[22] Filed: Mar. 24, 1975
[21] Appl. No.: 561,219

[30] Foreign Application Priority Data
Apr. 4, 1974  Japan.............................. 49-38467

[52] U.S. Cl........ 331/113 R; 178/DIG. 15; 331/144
[51] Int. Cl.² ........................................ H03K 3/283
[58] Field of Search..................... 331/113 R, 144; 178/DIG. 15

[56] References Cited
UNITED STATES PATENTS
3,483,484  12/1969  Luetze ............................ 331/113 R
3,593,278   7/1971  Bower.......................... 331/113 R X Primary Examiner—Siegfried H. Grimm
Attorney, Agent, or Firm—Lewis H. Eslinger; Alvin Sinderbrand

[57] ABSTRACT

A pulse generator circuit including first, second and third transistors in which the first and second transistors are associated with resistors and capacitors to form an astable multivibrator coupled power supply. The third transistor is connected between the astable multivibrator and a variable resistor, the latter being connected to the power supply and adapted to control the pulse width of an output signal derived from the astable multivibrator whereby the pulse width of the output signal is controlled to be substantially uniform regardless of changes in the power supply voltage and ambient temperature.

7 Claims, 9 Drawing Figures

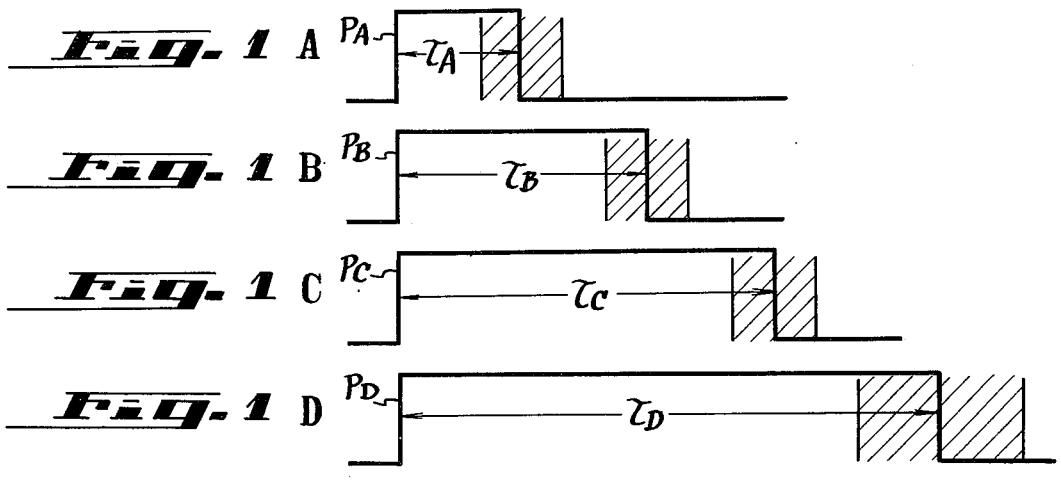
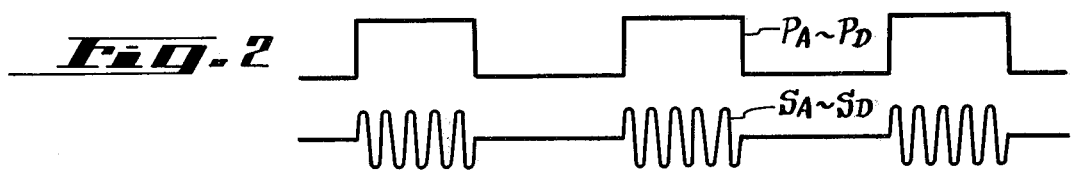
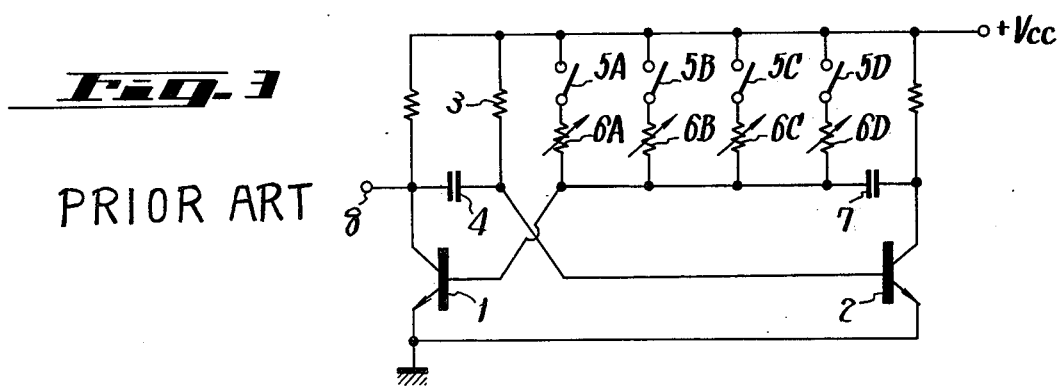

STABLE PULSE WIDTH CONTROL FOR ASTABLE MULTIVIBRATORS AND THE LIKE

BACKGROUND OF THE INVENTION

1. Field of the Invention

This invention relates generally to a pulse generator circuit and more particularly to such a circuit having a pulse width control circuit for controlling the pulse width to be substantially uniform regardless of changes in the power supply voltage and ambient temperature.

2. Description of the Prior Art

Pulse generator circuits are widely used in the electronic field for various purposes, and many kinds of such circuits are known in the prior art.

In such known pulse generator circuits, astable multivibrator circuits are often used because of their relatively simple circuit configuration. In some applications the astable multivibrator circuits are often used in cooperation with pulse width switching means so as to achieve a command or control function over other apparatus such as, for example, in the remote control apparatus for television receivers.

However, in the prior art pulse generator circuits utilizing astable multivibrator circuits, the circuit operation is significantly affected by changes in the power supply voltage or the ambient temperature, causing the width of the output pulse signal to fluctuate.

If the astable multivibrator circuit is used in cooperation with pulse width switching means for generating several pulse signals of different pulse widths, each representing a function to be controlled, such as, for example, in the remote control of a television receiver, such a fluctuation in the width of the output pulse signal often becomes critical because erroneous widths will be discriminated resulting in the performance of improper functions.

OBJECTS OF THE INVENTION

Accordingly, it is an object of the invention to provide an improved pulse generator circuit avoiding the disadvantage inherent in the prior art.

Another object of the invention is to provide an improved pulse generator circuit having pulse width control means.

A further object of the invention is to provide an improved pulse generator circuit which operates to uniformly control the pulse width of the generated signal regardless of changes in the power supply voltage and ambient temperature.

SUMMARY OF THE INVENTION

The pulse generator circuit according to the present invention includes first, second and third transistors. The first and second transistors are associated with resistors and capacitors to form an astable multivibrator which is coupled to a power supply.

A variable voltage supply means formed by a variable resistor connected to the power supply is provided and supplies a variable voltage to the base electrode of the third transistor.

The emitter electrode of the third transistor is connected to the emitter electrode of the first transistor and both emitter electrodes thereof are connected to ground through a parallel connection of a resistor and a capacitor.

In such a construction, the pulse width of the output signal derived from the pulse generator is controlled to be uniform regardless of changes in the power supply voltage or ambient temperature.

This invention will best be understood from the following detailed description read in connection with the accompanying drawings.

BRIEF DESCRIPTION OF THE DRAWINGS

FIGS. 1A – 1D and FIG. 2 are waveform diagrams which are useful in explaining the advantages of the present invention.

FIGS. 3 – 5, inclusive, are schematic diagrams of prior art pulse generator circuits.

DESCRIPTION OF THE PREFERRED EMBODIMENT

Figure 4:
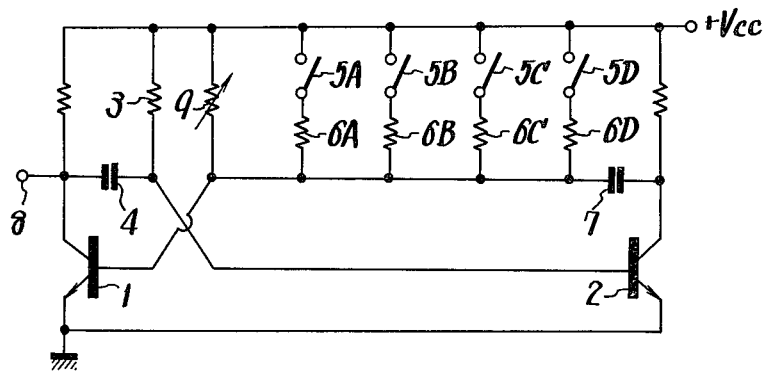

For the purpose of the present discussion, the present invention will be described in connection with one application thereof, e.g., the remote control of a remote device, such as a television receiver. However, this application should not be interpreted as limiting the present invention thereto, or as limiting the usefulness thereof.

When the sound volume control, channel selection and turning on and off of a power supply source in electronic instruments such as a television receiver and so on are carried out by remote control, a pulse generator circuit including an astable multivibrator often is provided as a remote control apparatus. For example, when the sound volume is lowered, a pulse $P_A$ whose pulse width is $\tau_A$ as shown in FIG. 1A is generated; and when the sound volume is increased, a pulse $P_B$ whose pulse width is $\tau_B$ as shown in FIG. 1B is generated. Also, when channel selection is carried out, a pulse $P_C$ whose pulse width is $\tau_C$ as shown in FIG. 1C is generated. Further, when the turning on and off of the power supply is carried out, a pulse $P_D$ whose pulse width is $\tau_D$ as shown in FIG. 1D is generated. Thus, pulses are generated having pulse widths which differ so as to correspondingly control selected objects. This technique is known. In one remote control embodiment, the generated pulses $P_A$ to $P_D$ are supplied to an oscillator to trigger high frequency signals $S_A$ to $S_D$ during the periods corresponding to the pulse widths of the pulses $P_A$ to $P_D$ as shown in FIG. 2. The high frequency signals $S_A$ to $S_D$ are then converted to, for example, corresponding ultrasonic waves. A receiver will receive the ultrasonic waves and reconvert them to the high frequency signals. The high frequency signals thus converted are detected as the original pulses $P_A$ to $P_D$ whose selective widths are used to carry out predetermined controls automatically.

FIG. 3 shows a prior art pulse generator circuit for generating pulses of preselected widths. In the example of FIG. 3, transistors 1 and 2 serve as the active elements of an astable multivibrator. The non-conductive period of the transistor 2 is determined by the time constant established by a resistor 3 and a capacitor 4, while the non-conductive period of the transistor 1 is determined by the time constant established by a capacitor 7 and one of resistors 6A to 6D which is connected thereto by turning on one of switches 5A to 5D. Accordingly, the pulse width of an output pulse, which may be obtained at an ouptut terminal 8 connected to the collector of the transistor 1, is determined by which of the switches 5A to 5D is turned on.

In general, it is rather difficult to manufacture a resistor which precisely exhibits its designated resistance value. By way of example, when a carbon coated resistor is used, its actual resistance value can be anywhere within a tolerance of ±5% with respect to its designated value. For this reason, in the example of FIG. 3, variable resistors are used as the resistors 6A to 6D, respectively, as shown in the figure, and their resistance values must be adjusted so as to conform to the predetermined values, respectively. As a result, with this prior art example, a number of components which must be adjusted becomes greater as the number of objects to be controlled increases, and accordingly it becomes difficult to manufacture the remote controlling pulse generator in mass-production.

To avoid this defect, there has been proposed in the prior art a pulse generator circuit of the type shown in FIG. 4 in which only a single component need be adjusted. In the example of FIG. 4, all the resistors 6A to 6D are formed as fixed resistors and a variable resistor 9 is connected in parallel to the resistors 6A to 6D.

With the prior art example of FIG. 4 the non-conductive period of the transistor 1 or the pulse width of its output pulse is determined by the parallel resistance of the variable resistor 9 and the one resistor 6A to 6D which is selected by one of the switches 5A to 5D. However, although the value of the variable resistor 9 can be adjusted to account for the range of tolerance of one resistor selected by the switch 5A to 5D so as to generate one pulse of predetermed width, it is difficult to generate another pulse of different predetermined value when another one of the resistors is selected by a further switch. That is, it is difficult for the pulse width, in the case where each of theswitches 5A to 5D is selectively switched on, to be set to its predetermined value.

Figure 5:
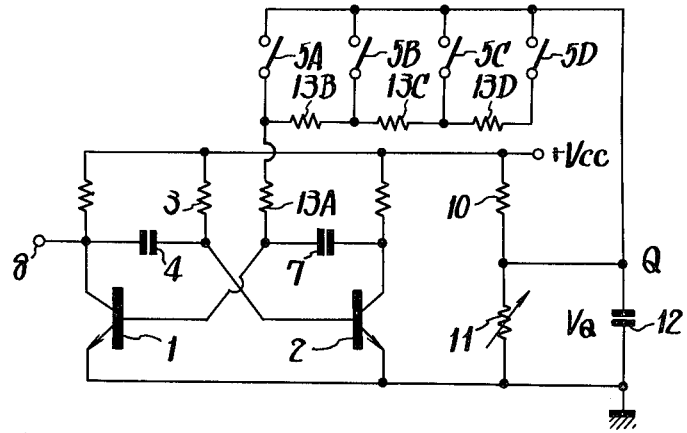

In another proposed circuit a voltage is supplied to a time constant circuit and is variable in value to suitably adjust the pulse width. FIG. 5 shows an example of this proposed circuit. In the circuit shown in FIG. 5, a series circuit of a fixed resistor 10 and a variable resistor 11 is connected between both ends of the power supply voltage source and a capacitor 12 is connected in parallel to the variable resistor 11. Further, between the connection point Q of the resistors 10 and 11 and the base of the transistor 1 there is connected a resistor 13A in series with a selected one or more of resistors 13B, 13C and 13D depending upon which one of the switches 5A to 5D is switched on selectively.

With the circuit construction shown in FIG. 5, the charged voltage $V_Q$ of the capacitor 12 can be varied by varying the resistance value of the variable resistor 11. As the charged voltage $V_Q$ is made low, the pulse width of an output pulse obtained at the output terminal 8 becomes wide. Since, the resistors 13A to 13D are connected in series and are of substantially the same resistance value and tolerance, it is known that when the resistance value of the variable resistor 11 is adjusted for a certain value so that the pulse width is set to one predetermined value when one of the switches 5A to 5D is turned on, the pulse width will have another, substantially correct predetermined pulse width when another one of the switches is turned on. Hence, the circuit of FIG. 5 is superior to that shown in FIG. 4.

With the circuit of FIG. 5, if it is assumed that the power supply voltage is $V_{CC}$, the forward voltage drop between the base-emitter of the transistor 1 is $V_{BE}$, the saturation voltage between its collector-emitter is $V_{CES}$, the total resistance value of the resistors connected between the connection point Q and the base of the transistor 1 is R, and the capacity of the capacitor 7 is C, the pulse width $\tau$ of the output pulse can be expressed as follows:

$$\tau = CR \ln \frac{V_Q + V_{CC} - V_{BE} - V_{CES}}{V_Q - V_{BE}} \quad (1)$$

When the pulse width is selectively changed so as to correspondingly effect the performance of a function as described above, it is necessary to maintain changes in the pulse width, which may be caused by variations of the power supply voltage and/or ambient temperature, within a predetermined tolerable range. If the changes in the pulse width exceeds this tolerable range, an erroneous function will be performed. For example in the remote control of a television receiver, although the channel selection is desired, the sound volume may be altered instead. If the pulse widths $\tau_A, \tau_B, \tau_C$ and $\tau_D$ of the pulses $P_A$ to $P_D$ shown in FIGS. 1A to 1D are selected as 15 ms (milli-second), 30 ms, 45 ms and 65 ms respectively, the tolerable ranges of changes in these respective pulse widths are about ±5 ms, ±5 ms, ±5 ms and ±10 ms, respectively. From this, it may be seen that the tolerable range over which the pulse width $\tau_C$ of the pulse $P_C$ must be constricted is most severe and is about 11%. Further, in practice, since secular variation in the respective component parts, errors in adjustment and so on must be taken into account, the tolerable range over which the pulse width is permitted to vary is at most several percent.

With the circuit shown in FIG. 5, when the power supply voltage is subjected to variations or fluctuations the pulse width changes will exceed the tolerable range of several percents by a significant amount, resulting in an error operation. That is when $V_{BE}=0.6V$, and $V_{CES}=0.1V$ and, if the ratio $V_Q/V_{CC}$ between the power supply voltage (which may be a battery voltage) $V_{CC}$ and the charged voltage $V_Q$ fluctuates, the pulse width determining factor K, which is expressed as:

$$K = \ln \frac{V_Q + V_{CC} - V_{BE} - V_{CES}}{V_Q - V_{BE}} \quad (2)$$

also fluctuates. This change in the pulse width is represented in the following Table I for a power supply voltage fluctuation between, for example, 3V (volts) and 2V.

Table 1

| $\dfrac{V_Q}{V_{CC}}$ | $V_{CC}=3V$ | | $V_{CC}=2V$ | $\dfrac{K_{2V}}{K_{3V}}$ |
|---|---|---|---|---|
| | $K_{3V}$ | $K_{3V}'$ | $K_{2V}$ | |
| 1.0 | 0.7929 | 0.826 | 0.8586 | 1.082 |
| 0.95 | 0.8285 | 0.863 | 0.9001 | 1.086 |
| 0.9 | 0.8671 | 0.903 | 0.9477 | 1.093 |
| 0.85 | 0.9122 | 0.950 | 1.0043 | 1.100 |
| 0.8 | 0.9593 | 1 | 1.0647 | 1.109 |
| 0.75 | 1.0152 | 1.058 | 1.1346 | 1.117 |
| 0.7 | 1.0750 | 1.120 | 1.2178 | 1.132 |
| 0.65 | 1.1474 | 1.196 | 1.3110 | 1.142 |
| 0.6 | 1.2296 | 1.281 | 1.4255 | 1.159 |
| 0.55 | 1.3244 | 1.380 | 1.5686 | 1.184 |
| 0.5 | 1.4398 | 1.500 | 1.7492 | 1.214 |

In the above Table 1, $K_{3V}$ represents the value of K when $V_{CC}$ is 3V, and $K_{2V}$ represents the value of K when $V_{CC}$ is 2V. $V_Q/V_{CC} = 1.0$ represents the case where the resistor 10 is not connected and the power supply voltage $V_{CC}$ is used to charge the capacitor 12 directly to the charged voltage $V_Q$. $K_{3V}'$ represents the normalized value of $K_{3V}$ whereat $K_{3V}$ is assumed to be 1 when $V_Q/V_{CC} = 0.8$ and the other values of $K_{3V}$ are divided accordingly by the normalizing factor.

As may be apparent from the above Table 1, with the circuit of FIG. 5, even if the ratio of the charged voltage $V_Q$ to the power supply voltage $V_{CC}$ ($V_Q/V_{CC}$) is selected to be any given value, the value of K, and accordingly the pulse width, changes between 8 – 20% or more as the power supply voltage $V_{CC}$ fluctuates between 2V and 3V. Accordingly, with the circuit of FIG. 5, when the power supply voltage $V_{CC}$ fluctuates, there is a strong possibility that an error operation will ensue.

The foregoing errors caused by power supply variations, described in connection with FIG. 5 are equally applicable to the prior art circuits shown in FIGS. 3 and 4.

An embodiment of the pulse generator circuit according to this invention which has only a single component to be adjusted and which is capable of accounting for the tolerances of circuit elements and wherein changes in the pulse width are kept within a tolerable range, will be hereinafter described with reference to FIG. 6.

Figure 6:
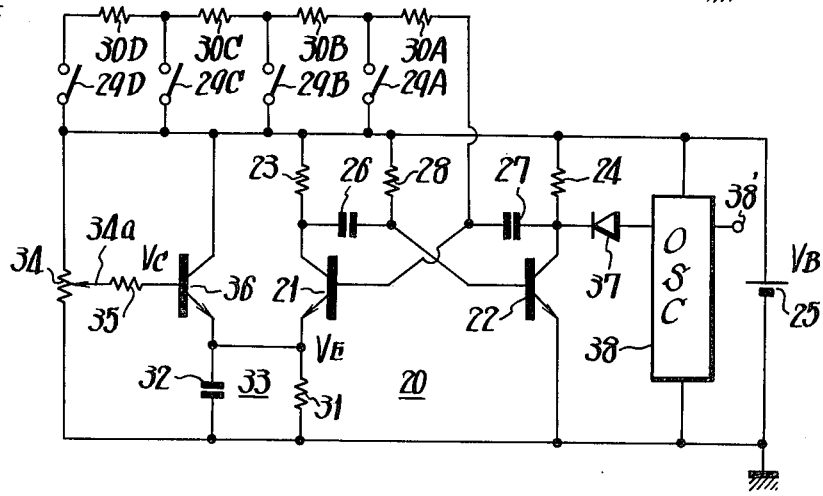
FIG. 6 is a schematic diagram of a pulse generator circuit according to the present invention.

In FIG. 6, reference numeral 20 generally indicates an astable multivibrator which includes two transistors 21 and 22. The collectors of the transistors 21 and 22 are connected through resistors 23 and 24 to one terminal, such as the positive terminal (in the illustrated example) of a power supply voltage source (or battery) 25, respectively. The collector of the transistor 21 is also connected through a capacitor 26 to the base of the transistor 22 and the collector of the transistor 22 is also connected through a capacitor 27 to the base of the transistor 21. The emitters of both the transistors 21 and 22 are connected to the other terminal, such as the negative terminal of the power supply. A resistor 28 is connected between the base of the transistor 22 and the power supply 25, while a selected one or more of resistors 30A, 30B, 30C and 30D are connected in series between the base of the transistor 21 and the power supply by selectively turning on one of switches 29A to 29D.

In the embodiment shown in FIG. 6, a parallel circuit 33 consisting of a resistor 31 and a capacitor 32 is connected between the emitter of the transistor 21 and the negative terminal of the power supply 25. A variable voltage dividing means such as, for example, a variable resistor 34 is connected across the power supply, and the dividing point or movable tap 34a thereof is connected through a resistor 35 to the base of another transistor 36 whose collector is connected to the power supply and whose emitter is connected to the emitter of the transistor 21. The collector of the transistor 22 is connected through a diode 37 to an oscillator 38 so as to switch on the oscillator during the period corresponding to the pulse width, that is, when the transistor 21 is non-conductive or in its off-state and the transistor 22 is conductive or in its on-state. Thus, a switched, oscillating output signal such as shown in FIG. 2 is obtained at an output terminal 38' connected to the oscillator 38.

With the circuit shown in FIG. 6, if it is assumed that the voltage of the power supply 25 is $V_B$, the base voltage of the transistor 36 is $V_C$, the emitter voltage of the transistors 36 and 21 is $V_E$, the forward voltage drops across the base-emitter of the transistors 36 and 21 is $V_{BE}$, the saturation voltage across the collector-emitter of the transistor 21 is $V_{CES}$, the total resistance value of the resistors connected between the base of the transistor 21 and the power supply is R, and the capacity of the capacitor 27 is C, then the pulse width of the output pulse (or period $\tau$ during which the transistor 21 is non-conductive and the transistor 22 is conductive) can be expressed as follows:

$$\tau = CR \ln \frac{2V_B - V_E - V_{BE} - V_{CES}}{V_B - V_E - V_{BE}} \quad (3)$$

Since $V_E = V_C - V_{BE}$, if it is substituted into the equation (3), the following equation (4) is derived.

$$\tau = CR \ln \frac{2V_B - V_C - V_{CES}}{V_B - V_C} \quad (4)$$

It may be appreciated from the equation (4) that since the power supply voltage $V_B$ exists in both the numerator and denominator of this expression, the value of $\tau$ is less affected by fluctuation of the voltage $V_B$.

With the circuit shown in FIG. 6, when $V_{CES}$ is selected as 0.1V ($V_{CES} = 0.1V$) and if the ratio between the voltage $V_B$ of the power supply 25 and the base voltage $V_C$ of the transistor 36 ($V_C/V_B$) is varied by changing the position of the movable tap 34a of the variable resistor 34, then the pulse width determining factor K, can be expressed by the following equation (5):

$$K = \ln \frac{2V_B - V_C - V_{CES}}{V_B - V_C} \quad (5)$$

The following Table 2 represents changes in the factor K (and thus the pulse width) for power supply fluctuations between 3 volts and 2 volts:

Table 2

| $\frac{V_C}{V_B}$ | $V_B = 3V$ | | $V_B = 2V$ | $\frac{K_{2V}}{K_3V}$ |
|---|---|---|---|---|
| | $K_{3V}$ | $K_{3V}'$ | $K_{2V}$ | |
| 0.4 | 0.9593 | 0.780 | 0.9477 | 0.98 |
| 1.4/3 | 1.0331 | 0.840 | 1.0224 | 0.98 |
| 1.6/3 | 1.1216 | 0.912 | 1.11 | 0.99 |
| 0.6 | 1.2286 | 1 | 1.2164 | 0.99 |
| 2/3 | 1.3609 | 1.107 | 1.3480 | 0.99 |
| 2.2/3 | 1.5314 | 1.246 | 1.5161 | 0.99 |
| 0.8 | 1.7630 | 1.434 | 1.7492 | 0.99 |
| 2.6/3 | 2.1102 | 1.71 | 2.0938 | 0.99 |

In Table 2, $K_{3V}$ represents the value of K when $V_B$ is 3V, $K_{2V}$ represents the value of K when $V_B$ is 2V, and $K_{3V}'$ represents the normalized value of $K_{3V}$ whereat $K_{3V}$ is assumed to be 1 when $V_C/V_B = 0.6$ and the other values are divided accordingly by the normalizing factor.

As may be apparent from Table 2, with the circuit of the invention shown in FIG. 6, the movable tap 34a of the variable resistor 34 can be set to provide the ratio $V_C/V_B$ with a range of 0.4 – 2.6/3; and if the power supply voltage $V_B$ fluctuates between 3V and to 2V, the factor K, and thus the pulse width, is subjected to only very small changes, on the order of 1–2%. Since the oscillator 38 is switched on during the period that the transistor 22 is conductive, the pulse width of the output of oscillation is substantially uniform even if the power supply voltage $V_B$ is changed.

Because the pulse width of the output pulse is subjected to very small changes only when the power supply voltage $V_B$ is changed, then even if the pulse width is slightly changed by reason of ambient temperature changes, the total pulse width variations due to power supply and temperature changes will still not exceed the tolerable range of several percents. It is appreciated that in the circuit shown in FIG. 6, the series connection of the resistors 30A to 30D is selectively established by operating corresponding ones of the switches 29A to 29D as in the case of FIG. 5. Hence, the circuit of this invention is superior to the circuit of FIG. 4, as described previously, and the pulse widths of the output pulses selectively generated by actuation of the appropriate switches 29A to 29D can be set as desired.

As described above, with the pulse generator circuit according to this invention, only a single component need be adjusted and the tolerances of the actual values of the circuit elements can be easily and positively compensated for and the pulse width of the output pulse is negligibly changed due to variations of the power supply voltage and ambient temperature. Thus, the occurrence of an error operation is avoided.

In addition to the illustrated example of variable voltage dividing means, various modifications could be used. By way of example, a series connection of two capacitors can be connected across the power supply voltage source, with the connection point between the two capacitors connected to the base of the transistor 36, and one of the capacitors can be made variable.

It may be apparent that many modifications and variations could be effected by one skilled in the art without departing from the spirit or scope of the novel concepts of the present invention. It is intended that the appended claims be interpreted to include all such modifications, variations and changes.

I claim as my invention:

1. A pulse generator circuit comprising:
   a. first, second and third transistors each having base, emitter and collector electrodes;
   b. first and second voltage terminals;
   c. means including first and second resistors for connecting the collector electrodes of said first and second transistors to said first voltage terminal respectively;
   d. a first capacitor connected between the collector electrode of said first transistor and the base electrode of said second transistor;
   e. a second capacitor connected between the collector electrode of said second transistor and the base electrode of said first transistor;
   f. means including a third resistor for connecting the base electrode of said second transistor to said first voltage terminal;
   g. means including a fourth resistor for connecting the base electrode of said first transistor to said first voltage terminal;
   h. means for connecting the emitter electrode of said second transistor to said second voltage terminal;
   i. means including a parallel connection of a fifth resistor and a third capacitor for connecting the emitter electrode of said first transistor to said second voltage terminal;
   j. an output terminal connected to at least one of the collector electrodes of said first and second transistors;
   k. a variable resistor having a pair of terminals and a variable tap therebetween;
   l. means for connecting the pair of terminals of said variable resistor between said first and second voltage terminals;
   m. means for connecting the base and emitter electrodes of said third transistor in series between the variable tap of said variable resistor and the emitter electrode of said first transistor; and
   n. means for connecting the collector electrode of said third transistor to said first voltage terminal.

2. A pulse generator circuit according to claim 1, wherein said circuit further comprises switching means for varying the resistance value of said fourth resistor.

3. A pulse generator circuit according to claim 2, wherein said fourth resistor consists of a series connection of a plurality of resistors and said switching means are operable to select the number of said plurality of resistors for varying the resistance value of said fourth resistor.

4. A pulse generator comprising an astable multivibrator circuit comprised of cross-coupled transistors, each coupled to a source of operating voltage; means coupled to said source of operating voltage for deriving a fraction of said operating voltage; emitter-follower means interconnected between said fraction deriving means and the emitter of one of said cross-coupled transistors to supply a proportion of said derived fraction to said one cross-coupled transistor; and a capacitor coupled to the emitter of said emitter-follower means for receiving said proportion of said derived fraction of said operating potential.

5. The pulse generator of claim 4 wherein said means for deriving a fraction of said operating voltage comprises an adjustable voltage divider.

6. The pulse generator of claim 5 further comprising variable resistance means for coupling the base of one of said cross-coupled transistors to said source of operating voltage.

7. The pulse generator of claim 6 wherein said variable resistance means comprises a plurality of resistors of substantially equal resistance value; and switch means selectively operable to select the number of resistors connected in series.

* * * * *